(12) United States Patent
Aoi

(10) Patent No.: US 7,696,627 B2
(45) Date of Patent: Apr. 13, 2010

(54) MULTILAYERED INTERCONNECT STRUCTURE AND METHOD FOR FABRICATING THE SAME

(75) Inventor: Nobuo Aoi, Hyogo (JP)

(73) Assignee: Panasonic Corporation, Osaka (JP)

( * ) Notice: Subject to any disclaimer, the term of this patent is extended or adjusted under 35 U.S.C. 154(b) by 234 days.

(21) Appl. No.: 11/665,474

(22) PCT Filed: Mar. 30, 2006

(86) PCT No.: PCT/JP2006/306637

§ 371 (c)(1),
(2), (4) Date: Apr. 16, 2007

(87) PCT Pub. No.: WO2007/007447

PCT Pub. Date: Jan. 18, 2007

(65) Prior Publication Data

US 2008/0150151 A1    Jun. 26, 2008

(30) Foreign Application Priority Data

Jul. 7, 2005    (JP) .............................. 2005-198302

(51) Int. Cl.
*H01L 29/40* (2006.01)
(52) U.S. Cl. ........... 257/774; 257/E23.01; 257/E23.001
(58) Field of Classification Search ................. 257/774, 257/E23.01
See application file for complete search history.

(56) References Cited

U.S. PATENT DOCUMENTS

| 2005/0181628 A1* | 8/2005 | Nobutoki et al. ............ 438/778 |
| 2005/0287714 A1* | 12/2005 | Walk et al. .................. 438/127 |
| 2006/0222997 A1* | 10/2006 | Kobayashi et al. .......... 430/141 |

FOREIGN PATENT DOCUMENTS

| JP | 2000-012532 | 1/2000 |
| JP | 3190886 B2 | 5/2001 |
| JP | 2001-230505 A | 8/2001 |
| JP | 2003-133411 A | 5/2003 |
| JP | 2004-162034 A | 6/2004 |
| JP | 2004-214345 A | 7/2004 |
| JP | 2004-304202 A | 10/2004 |

* cited by examiner

*Primary Examiner*—Tan N Tran
(74) *Attorney, Agent, or Firm*—McDermott Will & Emery LLP

(57) ABSTRACT

In the multilayered interconnect structure, an upper-layer interconnect is formed in an interlayer dielectric film formed on a lower-layer interconnect of copper, and the lower-layer interconnect and the upper-layer interconnect of copper are connected to each other through a via formed in the interlayer dielectric film. A layer of the interlayer dielectric film in contact with the lower-layer interconnect is made of a layer including, as a principal component, an aromatic compound containing a nitrogen atom having a lone pair of electrons in an aromatic ring.

2 Claims, 3 Drawing Sheets

MULTILAYERED INTERCONNECT STRUCTURE AND METHOD FOR FABRICATING THE SAME

RELATED APPLICATIONS

This application is the U.S. National Phase under 35 U.S.C. § 371 of International Application No. PCT/JP2006/306637, filed on Mar. 30, 2006, which claims priority of JP 2005-198302, filed on Jul. 7, 2005, the disclosures of which Applications are incorporated by reference herein.

TECHNICAL FIELD

The present invention relates to a multilayered interconnect structure and a method for fabricating the same, and more particularly, it relates to a multilayered interconnect structure using an organic interlayer dielectric film having a low dielectric constant and a function to prevent diffusion of copper ions and a method for fabricating the same.

BACKGROUND ART

As insulating films to be used as a copper diffusion barrier film in a VLSI (very large scale integration) having copper interconnects, a SiN film, a SiON film, a SiC film, a SiCO film and the like are conventionally known, and all of these films have a high dielectric constant of 4 or more. Therefore, in a multilayered interconnect structure, even when a low dielectric constant film is used as an interlayer dielectric film, the influence of the dielectric constant of the insulating film used as the copper diffusion barrier film is dominant. Accordingly, the effect to lower the dielectric constant by an interlayer dielectric film made of a low dielectric constant film in a multilayered interconnect structure is canceled by the dielectric constant of an insulating film used as the copper diffusion barrier film, and hence, a sufficiently low value has not been realized as the effective dielectric constant of the whole multilayered interconnect structure.

In order to cope with such a problem, it is necessary to lower the dielectric constant of an insulating film used as the copper diffusion barrier film or to provide an interlayer dielectric film made of a low dielectric constant film with a function as a copper diffusion barrier film.

As conventional technique to lower the dielectric constant of a copper diffusion barrier film, a method for forming a SiCN film through plasma CVD using trimethyl vinylsilane has been reported, and this SiCN film has a dielectric constant of 4. Alternatively, a method for forming a low dielectric constant interlayer dielectric film having a function as a copper diffusion barrier film through plasma CVD using divinylsiloxane bis-benzocyclobutene has been reported, and this interlayer dielectric film has a dielectric constant of approximately 2.7 (see, for example, Patent Document 1).

Patent Document 1: Japanese Patent No. 3190886

DISCLOSURE OF THE INVENTION

Problems to be Solved by the Invention

The SiCN film formed as a copper diffusion barrier film by using trimethyl vinylsilane has a dielectric constant of 4, and the dielectric constant is disadvantageously high.

On the other hand, in the case where a low dielectric constant interlayer dielectric film having a function as a copper diffusion barrier film is formed by using divinylsiloxane bis-benzocyclobutene, the dielectric constant is as low as approximately 2.7. If the interlayer dielectric film formed by using divinylsiloxane bis-benzocyclobutene is formed by an application method, the effect to prevent the diffusion of copper ions of the interlayer dielectric film to be formed is degraded, and therefore, it is formed by the plasma CVD. When this interlayer dielectric film is formed on copper by the plasma CVD using divinylsiloxane bis-benzocyclobutene, however, copper ions are diffused within the film at an early stage of the deposition. The copper ions are thus diffused probably because a film structure for capturing the copper ions has not been completed at the early stage of the deposition, and hence, the copper ions are diffused within the film due to the heat applied during the deposition. Furthermore, in the case where the interlayer dielectric film is formed by the plasma CVD using divinylsiloxane bis-benzocyclobutene, the process is performed at a high temperature where the substrate temperature is 300° C. or more, and hence, the copper ions are further remarkably diffused. Thus, when an interlayer dielectric film is formed to be directly in contact with copper by the plasma CVD using divinylsiloxane bis-benzocyclobutene, the deposition of the film is proceeded while the copper ions are diffusing within the film at the early stage of the deposition. Accordingly, a leakage current is caused and quality degradation such as lowering of the breakdown voltage is caused due to the diffused copper ions, resulting in a problem that the life of interconnects is largely shortened.

In consideration of the aforementioned conventional problem, an object of the invention is preventing diffusion of copper ions from a copper interconnect at an early stage of deposition of a low dielectric constant interlayer dielectric film having a copper ion diffusion preventing function.

Means for solving the Problems

In order to achieve the object, the multilayered interconnect structure according to a first aspect of the invention includes a lower-layer interconnect of copper; an upper-layer interconnect of copper formed in an interlayer dielectric film formed on the lower-layer interconnect; and a via formed in the interlayer dielectric film for connecting the lower-layer interconnect and the upper-layer interconnect to each other, and a layer of the interlayer dielectric film in contact with the lower-layer interconnect is made of a layer including, as a principal component, an aromatic compound containing a nitrogen atom having a lone pair of electrons in an aromatic ring.

Also, the method for fabricating a multilayered interconnect structure according to the first aspect of the invention includes the steps of forming an interlayer dielectric film on a lower-layer interconnect of copper; and forming, in the interlayer dielectric film, a via and an upper-layer interconnect of copper connected to the lower-layer interconnect through the via, and the step of forming an interlayer dielectric film includes a sub-step of forming a layer including, as a principal component, an aromatic compound containing a nitrogen atom having a lone pair of electrons in an aromatic ring as a layer of the interlayer dielectric film in contact with the lower-layer interconnect.

In the multilayered interconnect structure and the method for fabricating the same according to the first aspect of the invention, a copper ion is captured through coordination bond between the nitrogen atom having a lone pair of electrons and the copper ion, and hence, diffusion of copper ions from the lower-layer interconnect can be prevented at an early stage of deposition of the interlayer dielectric film. Accordingly, a breakdown failure otherwise caused through the diffusion of copper ions between adjacent copper interconnects through the interface between the lower-layer interconnect and the interlayer dielectric film can be prevented.

The multilayered interconnect structure according to a second aspect of the invention includes a lower-layer interconnect of copper; an upper-layer interconnect of copper formed in an interlayer dielectric film formed on the lower-layer interconnect; and a via formed in the interlayer dielectric film for connecting the lower-layer interconnect and the upper-layer interconnect to each other, and each of an uppermost layer and a lowermost layer of the interlayer dielectric film is made of a layer including, as a principal component, an aromatic compound containing a nitrogen atom having a lone pair of electrons in an aromatic ring.

Also, the method for fabricating a multilayered interconnect structure according to the second aspect of the invention includes the steps of forming an interlayer dielectric film on a lower-layer interconnect of copper; and forming, in the interlayer dielectric film, a via and an upper-layer interconnect of copper connected to the lower-layer interconnect through the via, and the step of forming an interlayer dielectric film includes a sub-step of forming a layer including, as a principal component, an aromatic compound containing a nitrogen atom having a lone pair of electrons in an aromatic ring as each of an uppermost layer and a lowermost layer of the interlayer dielectric film.

In the multilayered interconnect structure and the method for fabricating the same according to the second aspect of the invention, a copper ion is captured through coordination bond between the nitrogen atom having a lone pair of electrons and the copper ion, and hence, diffusion of copper ions from the lower-layer interconnect can be prevented at an early stage of deposition of the interlayer dielectric film. Accordingly, a breakdown failure otherwise caused through the diffusion of copper ions between adjacent copper interconnects through the interface between the lower-layer interconnect and the interlayer dielectric film can be prevented. In particular, the same plane as the uppermost face of a copper interconnect working as a diffusion path of copper from the copper interconnect can be vertically sandwiched between organic interlayer dielectric films each including, as a principal component, an aromatic compound containing a nitrogen atom having a lone pair of electrons in an aromatic ring, and therefore, the diffusion of copper ions between the adjacent copper interconnects can be more effectively prevented.

In the multilayered interconnect structure and the method for fabricating the same according to the first or second aspect of the invention, when the aromatic compound has an adamantane skeleton, an interlayer dielectric film good at heat resistance and strength can be obtained. Also, when the aromatic compound includes an imidazole derivative or an oxazole derivative, a nitrogen atom having a lone pair of electrons is contained in an aromatic ring.

In the method for fabricating a multilayered interconnect structure according to the first or second aspect of the invention, when an application method is employed, a molecular structure capable of preventing diffusion of copper ions can be formed at a low temperature in a solution or on a substrate, and therefore, the diffusion of the copper ions can be more effectively prevented during the deposition process.

Effects of the Invention

According to the multilayered interconnect structure and the method for fabricating the same of this invention, diffusion of copper ions from a copper interconnect can be prevented at an early stage of deposition of a low dielectric constant interlayer dielectric film having a copper ion diffusion preventing function. Therefore, multilayered interconnects having a low effective dielectric constant, namely, rapid multilayered interconnects having a short delay time, can be realized. As a result, a highly reliable multilayered interconnect structure can be realized.

Figure 1:
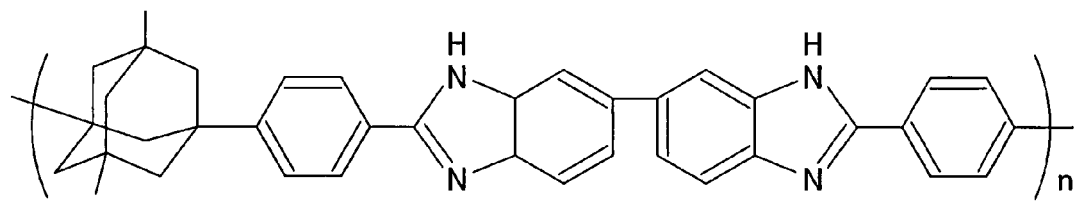
FIG. 1 is a diagram of a chemical structure for showing an exemplified structure of an insulting film including, as a principal component, an aromatic compound containing, in an aromatic ring, a nitrogen atom having a lone pair of electrons.

DESCRIPTION OF REFERENCE NUMERALS 1 interlayer dielectric film
2 first insulating film
3 barrier metal film
4 lower-layer interconnect
5 first organic interlayer dielectric film
6 second insulating film
7$a$ contact hole
7$b$ wiring groove
8 barrier metal film
9$a$ via
9$b$ upper-layer interconnect
10 second organic interlayer dielectric film
11 barrier metal film
12 via
21 first insulating film
22 first organic interlayer dielectric film
23 barrier metal film
24 lower-layer interconnect
25 second organic interlayer dielectric film
26 second insulating film
27 third organic interlayer dielectric film
28$a$ contact hole
28$b$ wiring groove
29 barrier metal film
30$a$ via
30$b$ upper-layer interconnect
31 third organic interlayer dielectric film
32 third insulating film
33 barrier metal film
34 via
2$a$ lone pair of electrons

BEST MODE FOR CARRYING OUT THE INVENTION

First, a characteristic common to Embodiments 1 and 2 of the invention will be described with reference to FIGS. 1 through 4.

In a multilayered interconnect structure and a method for fabricating the same according to each of Embodiments 1 and 2, in order to overcome the aforementioned conventional problem, namely, in order to prevent diffusion of copper ions from a copper interconnect at an early stage of deposition of a low dielectric constant interlayer dielectric film having a copper ion diffusion preventing function, an interlayer dielectric film including, as a principal component, an aromatic compound containing a nitrogen atom having a lone pair of electrons in an aromatic ring is used.

Owing to the presence of the nitrogen atom having a lone pair of electrons, a copper ion diffused from a copper interconnect is captured through coordination bond with the nitrogen atom, and hence, the diffusion of copper ions from the copper interconnect can be prevented at the early stage of the deposition of the interlayer dielectric film.

Figure 2:
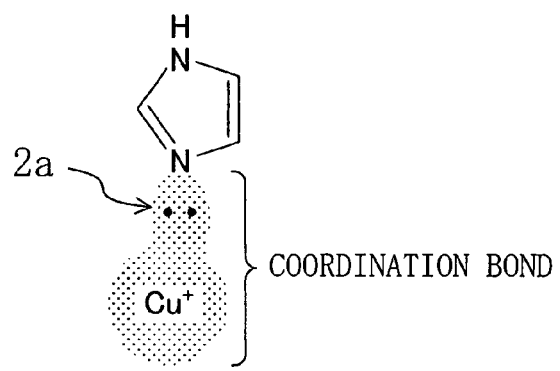
FIG. 2 is a schematic diagram for showing the mechanism for preventing diffusion of a copper ion by a nitrogen atom having a lone pair of electrons.

An example of the aromatic compound containing a nitrogen atom having a lone pair of electrons in an aromatic ring and used as the principal component of the interlayer dielectric film is shown in FIG. 1. As shown in FIG. 1, the aromatic compound of FIG. 1 includes an imidazole derivative and an adamantane derivative as components. In this case, as shown in FIG. 2, a nitrogen ion (N) having a lone pair $2a$ of electrons included in the imidazole derivative is coordination bonded to a copper ion ($Cu^+$), thereby preventing the diffusion of copper ions from the copper interconnect. Also, since the aromatic compound includes an adamantane skeleton, an interlayer dielectric film good at heat resistance and strength can be realized.

Figure 3:
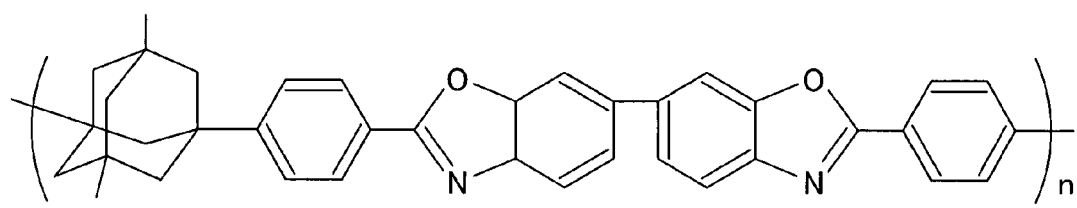
FIG. 3 is a diagram of a chemical structure for showing another exemplified structure of the insulating film including, as a principal component, an aromatic compound containing, in an aromatic ring, a nitrogen atom having a lone pair of electrons.
Figure 4:
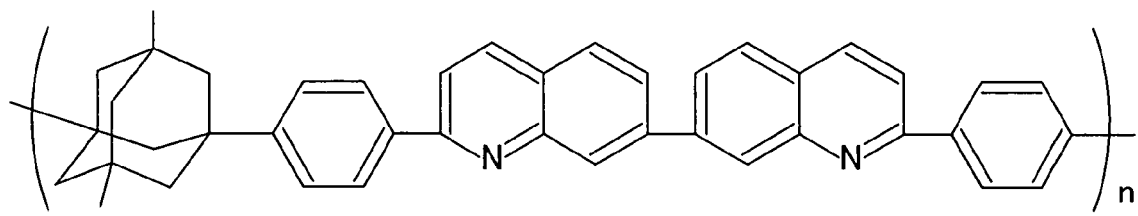
FIG. 4 is a diagram of a chemical structure for showing another exemplified structure of the insulating film including, as a principal component, an aromatic compound containing, in an aromatic ring, a nitrogen atom having a lone pair of electrons.

Alternatively, the aromatic compound containing a nitrogen atom having a lone pair of electrons in an aromatic ring may be an aromatic compound including an oxazole derivative or a pyridine derivative, instead of the imidazole derivative shown in FIG. 1, having a lone pair of electrons in an aromatic ring as shown in FIG. 3 or 4, and also in this case, the aforementioned effects can be attained. When the oxazole derivative is included, an interlayer dielectric film having a lower dielectric constant and a low water absorbing property can be realized.

Furthermore, in the method for fabricating a multilayered interconnect structure of Embodiment 1 or 2, an application method is employed. Thus, a molecular structure capable of preventing the diffusion of copper ions can be formed at a low temperature in a solution or on a substrate, and hence, the diffusion of copper ions can be more effectively prevented during the deposition process.

Although an aromatic compound containing a nitrogen atom having a lone pair of electrons in an aromatic ring is exemplified above, the nitrogen atom having a lone pair of electrons may be replaced with sulfur (S) or phosphorus (P) in some cases.

Now, the multilayered interconnect structures and the methods for fabricating the same according to Embodiments 1 and 2 will be described with reference to FIGS. 5 and 6.

EMBODIMENT 1

In the multilayered interconnect structure according to Embodiment 1 of the invention, an upper-layer interconnect of copper is formed in an interlayer dielectric film formed on a lower-layer interconnect of copper, and the lower-layer interconnect and the upper-layer interconnect are connected to each other through a via formed in the interlayer dielectric film. A layer of the interlayer dielectric film in contact with the lower-layer interconnect is made of a layer including, as a principal component, an aromatic compound containing a nitrogen atom having a lone pair of electrons in an aromatic ring.

Furthermore, the method for fabricating a multilayered interconnect structure according to Embodiment 1 of the invention includes the steps of forming an interlayer dielectric film on a lower-layer interconnect of copper; and forming, in the interlayer dielectric film, a via and an upper-layer interconnect of copper connected to the lower-layer interconnect through the via. The step of forming an interlayer dielectric film includes a sub-step of forming a layer including, as a principal component, an aromatic compound containing a nitrogen atom having a lone pair of electrons in an aromatic ring as a layer of the interlayer dielectric film in contact with the lower-layer interconnect.

Now, the embodiment will be specifically described.

Figure 5:
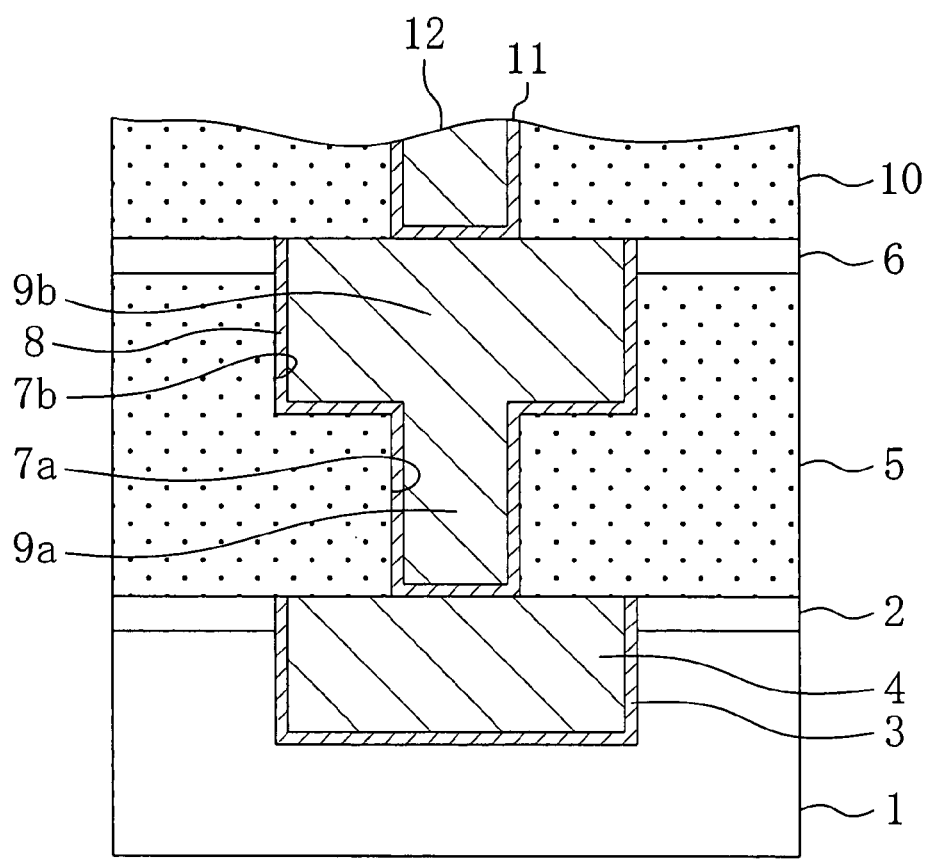
FIG. 5 is a cross-sectional view of a principal part for explaining a multilayered interconnect structure and a method for fabricating the same according to Embodiment 1 of the invention.

FIG. 5 is a cross-sectional view of a principal part for explaining the multilayered interconnect structure and the method for fabricating the same according to Embodiment 1 of the invention.

As shown in FIG. 5, a first insulating film 2 made of, for example, a SiOC film is formed on an interlayer dielectric film 1 on a substrate (not shown), and a lower-layer interconnect 4 having a bottom and a side face covered with a barrier metal film 3 and having a top face exposed from the first insulating film 2 is formed in the first insulating film 2 and the interlayer dielectric film 1. A first organic interlayer dielectric film 5 is formed in a thickness of 500 nm on the first insulating film 2 and the lower-layer interconnect 4, and a second insulating film 6 made of, for example, a SiOC film is formed in a thickness of 50 nm on the first organic interlayer dielectric film 5. At this point, the first organic interlayer dielectric film 5 is an interlayer dielectric film including, as a principal component, the aromatic compound containing a nitrogen atom having a lone pair of electrons in an aromatic ring shown in, for example, FIG. 1. The interlayer dielectric film 1 may have the same or different composition as or from, for example, the first insulating film 2 or the second insulating film 6, or may have the same composition as the first organic interlayer dielectric film 5.

Furthermore, an upper-layer interconnect 9b of copper having a side face and a bottom covered with a barrier metal film 8 is formed in the second insulating film 6 and the first organic interlayer dielectric film 5, and a via 9a having a side face and a bottom covered with the barrier metal film 8 for connecting the lower-layer interconnect 4 and the upper-layer interconnect 9b to each other is formed under the upper-layer interconnect 9b in the second insulating film 6 and the first organic interlayer dielectric film 5. Also, a second organic interlayer dielectric film 10 (made of an interlayer dielectric film including the aromatic compound shown in, for example, FIG. 1 as a principal component) having the same layered structure as the first organic interlayer dielectric film 5 and a third insulating film not shown are formed on the second insulating film 6 and the upper-layer interconnect 9b. In other words, the upper-layer interconnect 9b and an interconnect of a further upper layer (not shown) are connected to each other through a via 12 with a barrier metal film 11 sandwiched therebetween in the second organic interlayer dielectric film 10 and the third insulating film. In this manner, a layered structure similar to a layer composed of the first organic interlayer dielectric film 5 and the second insulating film 6 is repeatedly formed so as to construct the multilayered interconnect structure.

At this point, the via 9a and the upper-layer interconnect 9b covered with the barrier metal film 8 are formed through the following procedures: First, a contact hole 7a reaching the lower-layer interconnect 4 is formed in the first organic interlayer dielectric film 5 by photolithography and dry etching, and then, a wiring groove 7b communicated with the contact hole 7a is formed in the second insulating film 6 and the first organic interlayer dielectric film 5. Subsequently, the top face of the second interlayer dielectric film 6 and the side faces and the bottoms of the contact hole 7a and the wiring groove 7b are covered with the barrier metal film 8, and after forming a copper seed layer on the barrier metal film 8, a copper film is formed by plating until the contact hole 7a and the wiring groove 7b are completely filled. Thereafter, portions of the barrier metal film 8 and the copper film disposed outside the wiring groove 7b are removed through polishing by CMP, so as to form the via 9a and the upper-layer interconnect 9b covered with the barrier metal film 8. When these procedures are performed on the second interlayer dielectric film 10 and the third insulating film (not shown), the via 12 and the interconnect of the further upper layer covered with the barrier metal film 11 are formed in the second organic interlayer dielectric film 10 and the third insulating film. In this manner, when these procedures are repeatedly performed, the aforementioned multilayered interconnect structure can be formed.

In this manner, according to the multilayered interconnect structure and the method for fabricating the same of Embodiment 1 of the invention, the first organic interlayer dielectric film 5 is made of an interlayer dielectric film including the aromatic compound of, for example, FIG. 1 as the principal component. Therefore, as described above, owing to the nitrogen atom having a lone pair of electrons, diffusion of copper ions from the lower-layer interconnect 4 can be prevented at an early stage of the deposition of the first organic interlayer dielectric film 5. Accordingly, a breakdown failure otherwise caused through the diffusion of copper ions between adjacent copper interconnects through the interface between the lower-layer interconnect 4 and the first organic interlayer dielectric film 5 can be prevented. Furthermore, since the first organic interlayer dielectric film 5 and the second organic interlayer dielectric film 10 have a dielectric constant of 2.5, the multilayered interconnect structure attains a lower dielectric constant as compared with the case where a conventional SiC or SiCN film with a dielectric constant of 3.5 or more is formed on the lower-layer interconnect 4. Moreover, since the second organic interlayer dielectric film 10 is provided, a breakdown failure otherwise caused through the diffusion of copper ions between adjacent copper interconnects through the interface between the upper-layer interconnect 9b and the second organic interlayer dielectric film 10 can be similarly prevented.

Although the first insulating film 2, the second insulating film 6 and the third insulating film are made of a SiOC film in the multilayered interconnect structure and the method for fabricating the same of Embodiment 1 described above, each of these insulating films may have the same or different composition as or from the first organic interlayer dielectric film 5 and the second interlayer dielectric film 10.

The layered structure composed of the first organic interlayer dielectric film 5 and the second insulating film 6 described with respect to the multilayered interconnect structure and the method for fabricating the same of Embodiment 1 is merely an example and is not restrictive. For example, in each layer of a multilayered interconnect structure having the same layered structure as the layer composed of the first organic interlayer dielectric film 5 and the second insulating film 6, the thicknesses of an organic interlayer dielectric film disposed in a lower layer and the thickness of an insulating film disposed in an upper layer may be the same or different.

Furthermore, in the multilayered interconnect structure and the method for fabricating the same of Embodiment 1 described above, an insulating film having a different composition from the first organic interlayer dielectric film 5 may be provided as a layer including a region positioned directly beneath the bottom of the wiring groove 7b in the first organic interlayer dielectric film 5. Thus, the insulating film having the different composition from the first organic interlayer dielectric film 5 functions as an etching stopper in forming the wiring groove 7b by etching the first organic interlayer dielectric film 5, and therefore, process variation in the depth of the wiring groove 7b can be reduced. This modification is not limited to the first organic interlayer dielectric film 5 but may be similarly employed for each of the other layers of the multilayered interconnect structure such as the second organic interlayer dielectric film 10.

Although the contact hole 7a and the wiring groove 7b are formed in the first organic interlayer dielectric film 5 in the multilayered interconnect structure and the method for fabricating the same of Embodiment 1 described above, a layer where the contact hole 7a is formed and a layer where the wiring groove 7b is formed may be insulating films having different compositions. For example, when a porous film having higher porosity than an insulating film where the contact hole 7a is formed is used as an insulating film where the wiring groove 7b is formed, degradation in the mechanical strength of the multilayered interconnect structure can be suppressed. It is noted that this modification is not limited to the first organic interlayer dielectric film 5 but may be employed similarly for each of the other layers of the multilayered interconnect structure such as the second organic interlayer dielectric film 10.

Furthermore, when an interlayer dielectric film including an organic component as a principal component is used as an insulating film where the wiring groove 7b is formed and an interlayer dielectric film including a siloxane component as a principal component is used as an insulating film where the contact hole 7a is formed, the process variation in the depth of the wiring groove 7b can be reduced without providing the aforementioned layer functioning as an etching stopper, and the degradation in the mechanical strength of the multilayered interconnect structure can be suppressed. It is noted that this modification is not limited to the first organic interlayer dielectric film 5 but may be similarly employed for each of the other layers of the multilayered interconnect structure such as the second organic interlayer dielectric film 10.

Modification 2

In the multilayered interconnect structure according to Embodiment 2 of the invention, an upper-layer interconnect of copper is formed in an interlayer dielectric film formed on a lower-layer interconnect of copper, and the lower-layer interconnect and the upper-layer interconnect are connected to each other through a via formed in the interlayer dielectric film. Each of an uppermost layer and a lowermost layer of the interlayer dielectric film is made of a layer including, as a principal component, an aromatic compound containing a nitrogen atom having a lone pair of electrons in an aromatic ring.

Furthermore, the method for fabricating a multilayered interconnect structure according to Embodiment 2 of the invention includes the steps of forming an interlayer dielectric film on a lower-layer interconnect of copper; and forming, in the interlayer dielectric film, a via and an upper-layer interconnect of copper connected to the lower-layer interconnect through the via. The step of forming an interlayer dielectric film includes a sub-step of forming a layer including, as a principal component, an aromatic compound containing a nitrogen atom having a lone pair of electrons in an aromatic ring as each of an uppermost layer and a lowermost layer of the interlayer dielectric film.

Now, the embodiment will be specifically described.

Figure 6:
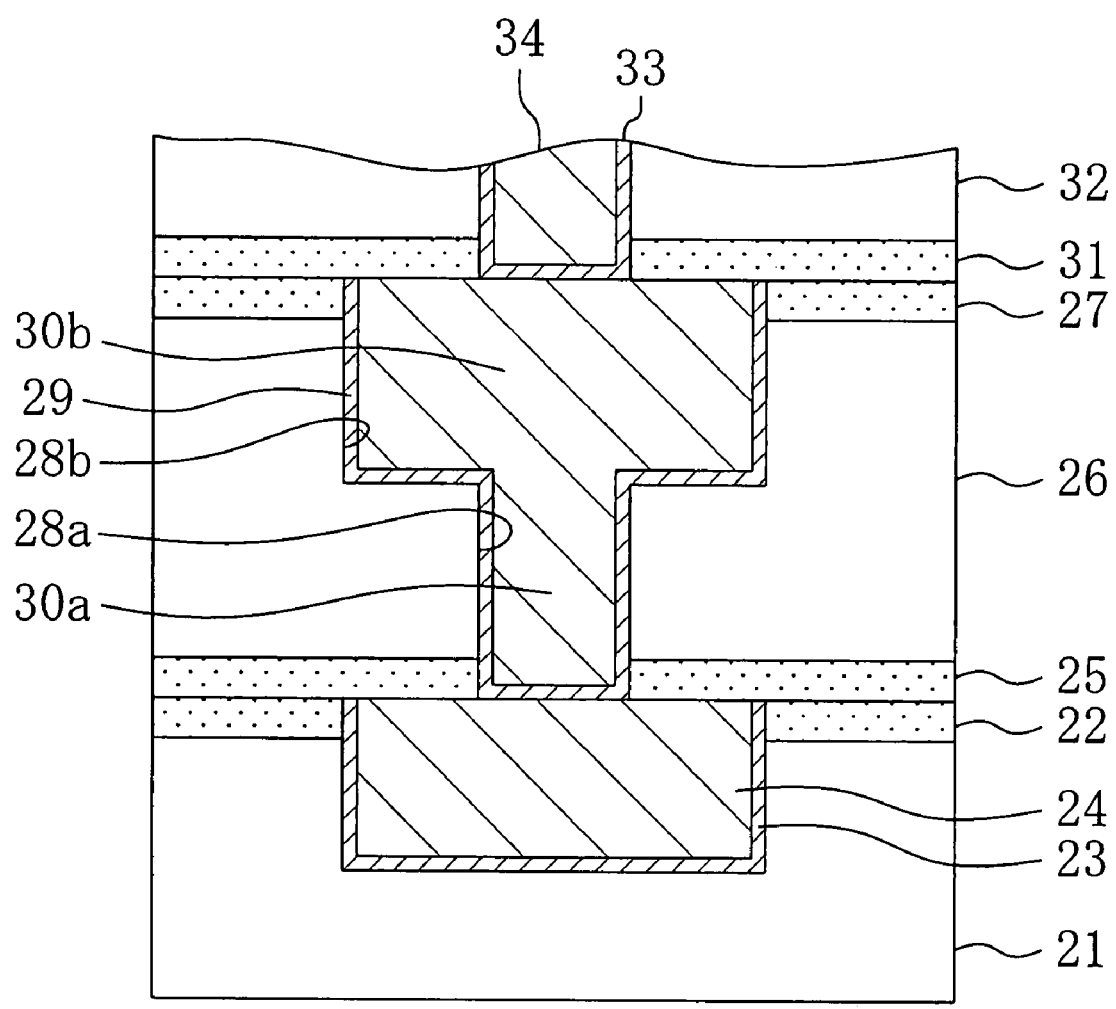
FIG. 6 is a cross-sectional view of a principal part for explaining a multilayered interconnect structure and a method for fabricating the same according to Embodiment 2 of the invention.

FIG. 6 is a cross-sectional view of a principal part for explaining the multilayered interconnect structure and the method for fabricating the same according to Embodiment 2 of the invention.

As shown in FIG. 6, a first organic interlayer dielectric film 22 is formed in a thickness of 50 nm on a first insulating film 21 of, for example, a SiOC film on a substrate (not shown), and a lower-layer interconnect 24 of copper having a bottom and a side face covered with a barrier metal film 23 and having a top face exposed from the first organic interlayer dielectric film 22 is formed in the first organic interlayer dielectric film 22 and the first insulating film 21. A second organic interlayer dielectric film 25 is formed in a thickness of 50 nm on the first organic interlayer dielectric film 22 and the lower-layer interconnect 24, and a second insulating film 26 of, for example, a SiOC film is formed in a thickness of 500 nm on the second organic interlayer dielectric film 25. Furthermore, a third organic interlayer dielectric film 27 is formed in a thickness of 50 nm on the second insulating film 26. At this point, each of the first, second and third organic interlayer dielectric films 22, 25 and 27 is an interlayer dielectric film including, as a principal component, the aromatic compound containing a nitrogen atom having a lone pair of electrons in an aromatic ring shown in, for example, FIG. 1.

Furthermore, an upper-layer interconnect 30b of copper having a side face and a bottom covered with a barrier metal film 29 is formed in the third organic interlayer dielectric film 27 and the second insulating film 26, and a via 30a having a side face and a bottom covered with the barrier metal film 29 for connecting the lower-layer interconnect 24 and the upper-layer interconnect 30b to each other is formed under the upper-layer interconnect 30b in the second insulating film 26 and the second organic interlayer dielectric film 25. Also, a fourth organic interlayer dielectric film 31 (made of an interlayer dielectric film including the aromatic compound shown in, for example, FIG. 1 as a principal component), a third insulating film 32 (made of a SiOC film) and a fifth organic interlayer dielectric film not shown (made of an interlayer dielectric film including the aromatic compound shown in, for example, FIG. 1) having the same layered structure as a layer composed of the first organic interlayer dielectric film 22, the second organic interlayer dielectric film 25 and the third organic interlayer dielectric film 27 are formed on the third organic interlayer dielectric film 27, the upper-layer interconnect 30b and the barrier metal film 29. In other words, the upper-layer interconnect 30b and an interconnect of a further upper layer (not shown) are connected to each other through a via 34 with a barrier metal film 33 sandwiched therebetween in the fourth organic interlayer dielectric film 31, the third insulating film 32 and the fifth organic interlayer dielectric film. In this manner, a layered structure similar to the layer composed of the second organic interlayer dielectric film 25, the second insulating film 26 and the third organic interlayer dielectric film 27 is repeatedly formed so as to construct the multilayered interconnect structure.

At this point, the via 30a and the upper-layer interconnect 30b covered with the barrier metal film 29 are formed through the following procedures: First, a contact hole 28a reaching the lower-layer interconnect 24 is formed in the second organic interlayer dielectric film 25 and the second insulating film 26 by the photolithography and the dry etching, and then, a wiring groove 28b communicated with the contact hole 28a is formed in the second insulating film 26 and the third organic interlayer dielectric film 27. Subsequently, the top face of the third interlayer dielectric film 27 and the side faces and the bottoms of the contact hole 28a and the wiring groove 28b are covered with the barrier metal film 29, and after forming a copper seed layer on the barrier metal film 29, a copper film is formed by the plating until the contact hole 28a and the wiring groove 28b are completely filled. Thereafter, portions of the barrier metal film 29 and the copper film disposed outside the wiring groove 28b are removed through polishing by the CMP, so as to form the via 30a and the upper-layer interconnect 30b covered with the barrier metal film 29. When these procedures are performed on the fourth organic interlayer dielectric film 31, the third insulating film 32 and the fifth organic interlayer dielectric film (not shown), the via 34 and the interconnect of the further upper layer covered with the barrier metal film 33 are formed in the fourth organic interlayer dielectric film 31, the third insulating film 32 and the fifth organic interlayer dielectric film. In this manner, when these procedures are repeatedly performed, the aforementioned multilayered interconnect structure can be formed.

In this manner, according to the multilayered interconnect structure and the method for fabricating the same of Embodiment 2 of the invention, organic interlayer dielectric films each including, for example, the aromatic compound shown in FIG. 1 as a principal component (i.e., the first organic interlayer dielectric film 22 and the second organic interlayer dielectric film 25 for the lower-layer interconnect 24 and the third organic interlayer dielectric film 27 and the fourth organic interlayer dielectric film 31 for the upper-layer interconnect 30b) are formed so as to vertically sandwich the same plane as the uppermost face of each of the copper interconnects (i.e., the lower-interconnect 24 and the upper-interconnect 30b). Therefore, owing to nitrogen atoms each having a lone pair of electrons included in the organic interlayer dielectric films vertically sandwiching the same plane as the uppermost face of the copper interconnect, diffusion of copper ions from the copper interconnect can be prevented at an early stage of the deposition of the organic interlayer dielectric films. In particular, in this embodiment, the same plane as the uppermost face of the copper interconnect working as the diffusion path of copper from the copper interconnect corresponds to the interface between the organic interlayer dielectric films each including, for example, the aromatic compound of FIG. 1 as a principal component, and therefore, a breakdown failure otherwise caused through diffusion of copper ions between adjacent copper interconnects can be prevented. Moreover, since each of the first, second, third and fourth organic interlayer dielectric films 22, 25, 27 and 31 has a dielectric constant of 2.5, the multilayered interconnect structure attains a lower dielectric constant as compared with the case where a conventional SiC or SiCN film with a dielectric constant of 3.5 or more is formed on a copper interconnect.

Furthermore, in the multilayered interconnect structure and the method for fabricating the same of Embodiment 2, the layered structure composed of the second organic interlayer dielectric film 25, the second insulating film 26 and the third organic interlayer dielectric film 27 is described merely as an example and is not restrictive. For example, in each layer of a multilayered interconnect structure having the same layered structure as the layer composed of the second organic interlayer dielectric film 25, the second insulating film 26 and the third organic interlayer dielectric film 27, the thickness of organic interlayer dielectric films provided as upper and lower layers may be the same as or different from the thickness of an insulating film provided as an intermediate layer.

Although the first insulating film 21, the second insulating film 26 and the third insulating film are made of a SiOC film in the multilayered interconnect structure and the method for fabricating the same of Embodiment 2 described above, each of these insulating films may have the same or different composition as or from the first organic interlayer dielectric film 22, the second organic interlayer dielectric film 25, the third organic interlayer dielectric film 27 or the fourth organic interlayer dielectric film 31.

Furthermore, in the multilayered interconnect structure and the method for fabricating the same of Embodiment 2 described above, an insulating film having a different composition from the second insulating film 26 may be provided as a layer including a region positioned directly beneath the bottom of the wiring groove 28b in the second insulating film 26. Thus, the insulating film having the different composition from the second insulating film 26 functions as an etching stopper in forming the wiring groove 28b by etching the second insulating film 26, and therefore, process variation in the depth of the wiring groove 28b can be reduced. This modification is not limited to the second insulating film 26 but may be similarly employed for each of the other layers of the multilayered interconnect structure such as the third insulating film 32.

Although the contact hole 28a and the wiring groove 28b are formed in the second insulating film 26 in the multilayered interconnect structure and the method for fabricating the same of Embodiment 2 described above, a layer where the contact hole 28a is formed and a layer where the wiring groove 28b is formed may be insulating films having different compositions. For example, when a porous film having higher porosity than an insulating film where the contact hole 28a is formed is used as an insulating film where the wiring groove 28b is formed, degradation in the mechanical strength of the multilayered interconnect structure can be suppressed. It is noted that this modification is not limited to the second insulating film 26 but may be employed similarly for each of the other layers of the multilayered interconnect structure such as the third insulating film 32.

Furthermore, when an interlayer dielectric film including an organic component as a principal component is used as an insulating film where the wiring groove 28b is formed and an interlayer dielectric film including a siloxane component as a principal component is used as an insulating film where the contact hole 28a is formed, the process variation in the depth of the wiring groove 28b can be reduced without providing the aforementioned layer functioning as an etching stopper, and the degradation in the mechanical strength of the multilayered interconnect structure can be suppressed. It is noted that this modification is not limited to the second insulating film 26 but may be employed similarly for each of the other layers of the multilayered interconnect structure such as the third insulating film 32.

INDUSTRIAL APPLICABILITY

The present invention is useful for forming rapid multilayered interconnects with small interconnect delay.

The invention claimed is:

1. A multilayered interconnect structure comprising:
    a lower-layer interconnect of copper;
    an upper-layer interconnect of copper formed in an interlayer dielectric film formed on said lower-layer interconnect; and
    a via formed in said interlayer dielectric film for connecting said lower-layer interconnect and said upper-layer interconnect to each other,
    wherein the interlayer dielectric film comprises an aromatic compound, and the aromatic compound includes an imidazole derivative having an adamantane skeleton, an oxazole derivative having an adamantane skeleton or a pyridine derivative having an adamantane skeleton;
    wherein each of an uppermost layer and a lowermost layer of said interlayer dielectric film is made of a layer including, as a principal component, the aromatic compound containing a nitrogen atom having a lone pair of electrons on an aromatic ring.

2. The multilayered interconnect structure of claim 1,
    wherein a dielectric constant of the dielectric film is less than 3.5.

* * * * *